United States Patent [19]

Kenmochi

[11] Patent Number: 5,234,744
[45] Date of Patent: Aug. 10, 1993

[54] ILLUMINATED BUTTON KEY

[75] Inventor: Yoshio Kenmochi, Ichihara, Japan

[73] Assignee: Sunarrow Co., Ltd., Tokyo, Japan

[21] Appl. No.: 915,935

[22] Filed: Jul. 17, 1992

[30] Foreign Application Priority Data

Sep. 20, 1991 [JP] Japan ................... 3-268505

[51] Int. Cl.$^5$ ............................... B32B 9/00
[52] U.S. Cl. ............................ 428/195; 200/310; 200/312; 200/314; 200/315; 341/22; 341/23; 341/32; 428/204; 428/206
[58] Field of Search ............... 200/310, 312, 314; 428/204, 206, 195

[56] References Cited

U.S. PATENT DOCUMENTS

| 4,882,581 | 11/1989 | Inobe et al. | 200/310 |
| 4,937,408 | 6/1990 | Hattori et al. | 200/314 |
| 5,120,920 | 6/1992 | Moriike | 200/310 |

Primary Examiner—Patrick J. Ryan
Assistant Examiner—Abraham Bahta
Attorney, Agent, or Firm—Hedman, Gibson & Costigan

[57] ABSTRACT

An illuminated key button is disclosed which is formed of a light permeable hard resin and has on the bottom of the key a print layer which is illuminated from below and is integral with the operating portion of the key button.

3 Claims, 2 Drawing Sheets

ILLUMINATED BUTTON KEY

BACKGROUND OF THE INVENTION

1. Field of the Invention

The present invention relates to a compact illuminated button key which is conveniently used at night or a dark place, as a key for various moving communications such as a portable telephone or an automotive telephone, or other various terminal keys.

2. Description of the Prior Art

In prior art rubber key is composed of a flat pad portion (a non-operating portion), a skirt portion inflated upwardly from said pad portion and a key top portion (an operating portion) formed above said skirt portion, and a further key top with a flange formed of a hard resin is placed on the first key top portion, the flange portion of the key top being held so as not to be slipped out by a frame. The key top portion is bored with an illuminating hole.

SUMMARY OF THE INVENTION

Since the key top portion and the key top with a flange formed of a hard resin placed thereon of the aforesaid rubber key are merely in contact with each other but not fixed, there is a difficulty such that said contact portion is displaced when the key is struck, and in addition, there is a disadvantage such that a frame is unavoidably required so that the whole structure becomes bulky, failing to provide a compact design. Furthermore, as an illuminated button key, the key top portion is necessarily subjected to cumbersome boring for illumination, resulting in a difficulty such that characters or symbols on the surface of the key top are not uniformly illuminated.

The present invention has been achieved in view of the above-described points. An object of the present invention is to provide an illuminated button key in which when a key is struck, a key top portion is positively operated without being displaced, which can be assembled in compact without requiring a frame, and which can uniformly illuminate characters or symbols displayed on the key top without making an illuminating hole in the key top portion so that the characters or the like can be clearly discriminated even at a dark place or the like.

According to the present invention, there is provided an illuminated button key wherein a key top formed of a light permeable hard resin is formed on the back with a stripping character print layer such as numerals, symbols, etc., said stripping character print layer being formed on the back with a chromatic color light permeable print layer, said chromatic color light permeable print layer having the back to which is adhered an upper surface of an operating portion formed of a light permeable flexible rubber or a flexible resin through a light permeable adhesive, said operating integral with a non-operating portion, and non-light permeable coating layers are formed on the remaining operating portion except the upper surface of the operating portion and surfaces of the non-operating portion.

Further, a skirt portion constituting a part of the operating portion adjacent to the non-operating portion and an annular holding portion adjacent to the upper portion of said skirt portion are formed of a non-light permeable flexible rubber or a flexible resin, said annular holding portion being internally formed of a light permeable movable block.

Moreover, a skirt portion constituting a part of the operating portion adjacent to the non-operating portion and an annular holding portion adjacent to the upper portion of said skirt portion are formed of a non-light permeable flexible rubber or a flexible resin, said annular holding portion being formed at the lower portion thereof with a light permeable movable block, and a light difusion space portion being formed to be encircled by the back of the key top, an inner peripheral suraface of the annular holding portion and the upper surface of the movable block.

The light permeable adhesive used in the present invention means the case where a primary treatment agent chemically activated with a flexible rubber or a flexible resin is solely used, and includes the case where both the primary treatment agent and the adhesive are used, and the case where the adhesive is solely used.

The light radiated from a light source for illumination passes through the operating portion formed of a light permeable material and the non-operating portion but is cut off by the coating layer, a part of which is reflected. The light reached the upper surface of the operating portion among the light having passed through the operating portion passes through the adhesive layer and is colored in desired chromatic color light as it passes through a chromatic color light permeable print layer. The chromatic color light passes through only a stripping character portion of a stripping character print layer and passes through a key top formed of a light permeable hard resin. The chromatic color character rise to the eyes. The remaining operating portion except the upper surface of the operating portion and the surfaces of the non-operating portion are coated with the non-light permeable coating layer, and therefore, light does not leak outside.

Further, since the upper surface of the operating portion formed of a light permeable flexible rubber or a flexible resin and the key top formed of a light permeable hard resin are adhered by the light permeable adhesive, they are positively turned on and off without being displaced when the key is struck, and no frame is required. A thin and compact design can be made.

In the case where the skirt portion constituting a part of the operating portion adjacent to the non-operating portion and the annular holding portion adjacent to the upper portion of the skirt portion are formed of a non-light permeale flexible rubber or flexible resin, the light radiated from a light source for illumination passes through only the light permeable movable block portion formed internally of the annular holding portion, and the thus passed-through light passes through the adhesive layer. When this light passes through the chromatic color light permeable print layer, it is colored in desired chromatic color light, which passes through only the stripping character portion of the character print layer. The light passes through the key top formed of a light permeable hard resin and the colored character rises to the eyes. Since the non-operating portion, the skirt portion constituting a part of the operating portion adjacent thereto and the annular holding portion adjacent to the upper portion of the skirt portion are formed of a light permeable flexible rubbler of a flexible resin, light does not leak outside therefrom.

Further, in the case where the non-operating portion, the skirt portion constituting a part of the operating portion adjacent thereto and the annular holding portion adjacent to the upper portion of the skirt portion are formed of a non-light permeable flexible rubber or a flexible resin, the annular holding portion being formed at the lower part with a light permeable movable block and the light diffusion space portion being formed to be encircled by the back of the key top, the inner peripheral suraface of the annular holding portion and the upper surface of the movable block, the light radiated from a light source for illumination passes through only the light permeable movable block portion formed at the lower part of the annular holding portion. The thus passed through light is radiated while being uniformly diffused in the light diffusion space portion and passes through the adhesive layer. When the light passes through the chromatic color light permeable print layer passes through, it is colored in desired colored light, which passes through only the stripping character portion of the stripping character print layer. The light passes through the key top formed of a light permeable hard resin, and the chromatic color character rise to the eyes. Since the non-operating portion, the skirt portion constituting a part of the operating portion adjacent thereto and the annular holding portion adjacent to the upper portion of the skirt portion are formed of a non-light permeable flexible rubber or a flexible resin, light does not leak outside therefrom.

As will be understood from the above described, according to the present invention, a key top formed of a light permeable hard resin is formed on the back with a stripping character print layer such as numerals, symbols, etc., said stripping character print layer being formed on the back with a chromatic color light permeable print layer, said chromatic color light permeable print layer having the back to which is adhered an upper surface of an operating portion formed of a light permeable flexible rubber or a flexible resin through a light permeable adhesive, said operating portion being formed of said light permeable material integral with a non-operating portion, and non-light permeable coating layer are formed on the remaining operating portion except the upper surface of the operating portion and surfaces of the non-operating portion. Therefore, when a key is struck, the key top portion is positively turned on and off without being displaced from the upper surface of the operating portion, and a compact assembly can be made without requiring a frame. In addition, only the characters, symbols, etc. displayed on the key top are uniformly illuminated without making a hole for illumination in the key top portion, and efficient illumination can be accomplished without having light leaked outside, and the characters or the like can be clearly discriminated at a dark place.

Further, in the case where the skirt portion constituting a part of the operating portion adjacent to the non-operating portion and the annular holding portion adjacent to the upper portion of the skirt portion are formed of a non-light permeable flexible rubber or a flexible resin, the light radiated from the light source passes through only the light permeable movable block portion formed internally of the annular holding portion. The evenness of light is obtained and less attenuation of light occurs so that light is bright. A construction having a high strength in terms of construction is obtained. The light colored in desired colored light passes through only the stripping character portion of the stripping character print layer and passes through the key top formed of a light permeable hard resin, and the chromatic color character rises to the eyes. Further-more, since the non-operating portion, the skirt portion constituting a part of the operating portion adjacent thereto and the annular holding portion adjacent to the upper portion of the skirt portion are formed of a non-light permeable flexible rubber of a flexible resin, light does not leak outside therefrom and can be shielded by a simple construction.

Moreover, in the case where the non-operating portion, the skirt portion constituting a part of the operating portion adjacent thereto and the annular holding portion adjacent to the upper portion of the skirt portion are formed of a non-light permeable flexible rubber or a flexible resin, said annular holding portion being formed at the lower part with the movable block and the light diffusion space portion being formed to be encircled by the back of the key top, the inner peripheral surface of the annular holding portion and the upper surface of the movable block body, the light radiated from the light source passes through only the light permeable movable block portion formed at the lower part of the annular holding portion. The evenness of light is obtained and less attenuation of light occurs so that the light is bright. The thus passed through light is radited while being uniformed diffused in the light diffusion space portion and passes through the adhesive agent. When the light passes through the chromatic color light permeable print layer, it is cored in a desired chromatic color light. The chromatic color light passes through only the stripping character portion of the stripping character print layer and passes through the key top formed of a light permeable hard resin. The chromatic color character more clearly rises to the eyes.

DESCRIPTION OF THE PREFERRED EMBODIMENTS

One embodiment of the present invention will be described hereinafter with reference to the drawings.

Figure 1:
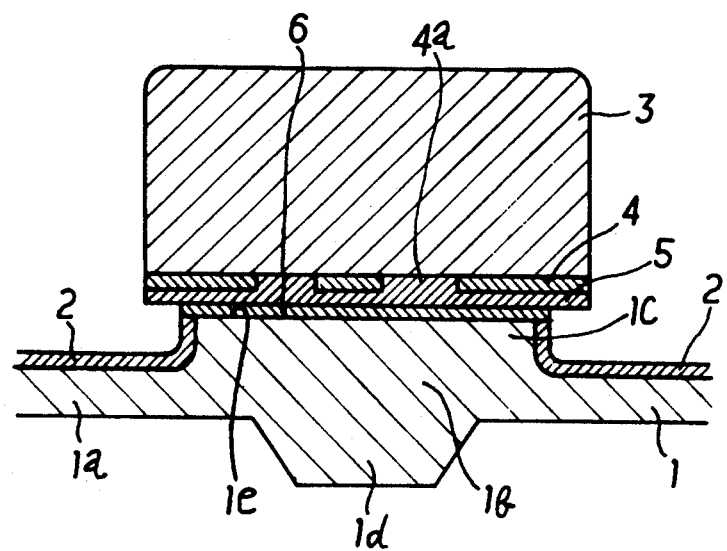
FIG. 1 is an enlarged sectional view of a button key according to one embodiment of the present invention.

In FIG. 1, reference numeral 1 denotes a pad in which a non-operating portion 1a and an operating portion 1b are integrally formed of a light permeable material of a flexible rubber such as a transparent silicon rubber or a flexible resin. While in the present illustration, the operating portion 1b is formed from an inflated portion 1c whose upper portion is inflated into a flat upper surface and a projecting portion 1d whose lower portion is downwardly projected, it is to be noted that the configuration is not always limited thereto but the operating portion 1b may be formed from a thick skirt portion upwardly inflated from an upper portion or a midportion or a lower portion of the side of the non-operating portion 1a, and a key top portion adjacent to the upper portion of the skirt portion. Non-light permeable coating layers 2 are formed on the remaining operating portion 1b except a flat upper surface 1e of the inflated portion 1c of the operating portion 1b and surfaces of the non-operating portion 1a. A leak of light outside can be prevented by the formation of the coating layer 2.

Numeral 3 denotes a key top formed of a light permeable hard resin such as a transparent material, which is a portion directly struck by a finger. The key top 3 is formed on the back thereof with a stripping character print layer 4 such as numerals, symbols and so on. Accordingly, light passes through only a stripping character portion 4a of the stripping character print layer 4, and light does not pass through other print portions but is shielded.

Numeral 5 denotes a chromatic color light permeable print layer formed on the back of the stripping character print layer 4 so that the stripping character portion 4a comes out in a desired color.

Numeral 6 denotes a light permeable adhesive for adhering the back of the chromatic color light permeable print layer 5 to the flat upper surface 1e of the inflated portion 1c of the operating portion 1b of flexible rubber or flexible resin formed of a transparent material. The key top 3 formed of the light permeable hard resin is adhered to the upper surface 1e of the operating portion formed of a light permeable material of flexible rubber or flexible resin different from that of the upper surface 1e whereby when the key top 3 is struck, the positive on and off operation can be accomplished without displacement between the back of the key top 3 and the flat upper surface 1e of the inflated portion 1c of the operating portion 1b. Further, no frame for holding the key top 3 is not required and a compact design can be made. Since a light permeable adhesive is used, light from an illuminating light source is not shielded by the presence of the adhesive, and light such as chromatic color character is sent to the key top.

The light permeable adhesive used in the present embodiment means the case where a primary treatment agent chemically activated with a flexible rubber or a flexible resin is solely used, and includes the case where both primary treatment agent and the adhesive are used, or the case where the adhesive is solely used.

Figure 2:
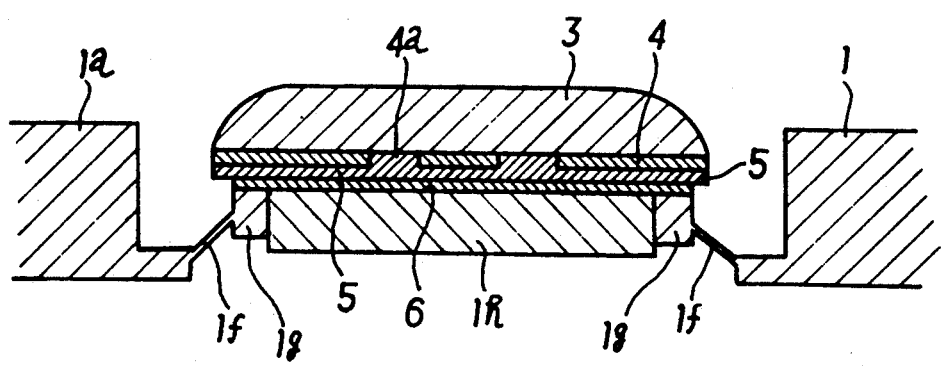
FIG. 2 is an enlarged sectional view of a button key according to a further embodiment of the present invention.

FIG. 2 is an enlarged sectional view of a key showing a further embodiment of the present invention.

FIG. 2 is the same in basic construction as that of FIG. 1 except main differences as follows. That is, a key pad 1 integrally formed with a non-operating portion 1a and an operating portion 1b is formed of a flexible rubber or a flexible resin of non-light permeable silicon rubber, and the operating portion 1b is formed from a thin skirt portion 1f inflated upwardly from an upper portion, a midportion or a lower portion of the side of the non-operating portion 1a, an annular holding portion 1g adjacent to the upper portion of the skirt portion 1f, and a light permeable movable block 1h formed internally of the annular holding portion 1g. The key pad 1 is formed of a non-light permeable flexible rubber or flexible resin as described above, whereby a leak of light from an illuminating light source outside the key can be simply shielded. Further, the light permeable movable block 1h not only can make uniform light to be illuminated against the stripping character portion 4a of the stripping character print layer 4 but also can lessen attenuation of light to make light bright.

Figure 3:
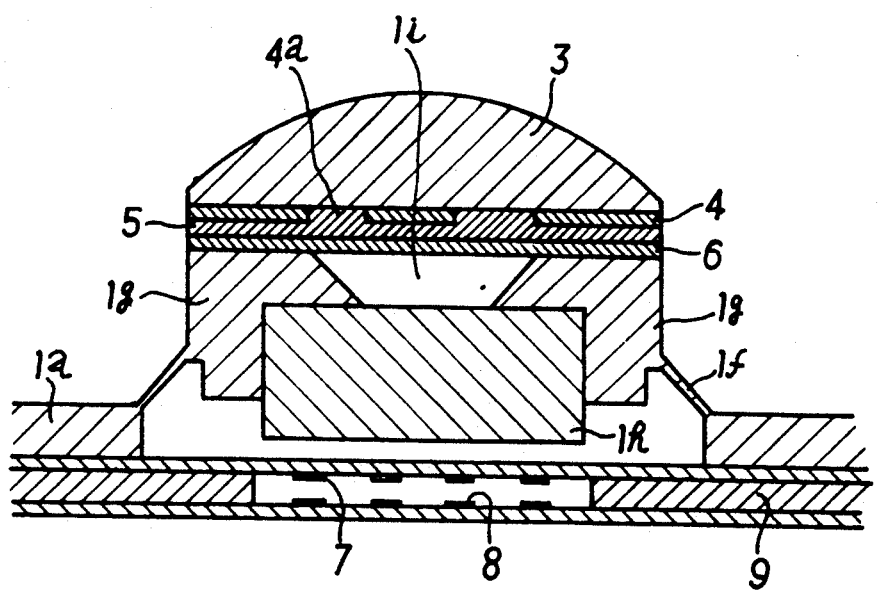
FIG. 3 is an enlarged sectional view of a button key according to still another embodiment of the present invention.

FIG. 3 is an enlarged sectional view of a key showing a still another embodiment of the present invention.

The present embodiment also has a construction similar to that of FIG. 1 except main differences as follows. That is, the construction of FIG. 3 is similar to that of FIG. 2 in that a key pad 1 integrally formed from a non-operating portion 1a and an operating portion 1b is formed of a non-light permeable flexible rubber or flexible resin, and that the operating portion 1b is formed from a thin skirt portion 1f inflated upwardly from an upper portion, a midportion or a lower portion of the side of the non-operating portion 1a, and an annular holding portion 1g adjacent to the upper portion of the skirt portion 1f, but is different from that of FIG. 2 in that the annular holding portion 1g is formed at the lower part with a light permeable movable block 1h, and that a light diffusion space portion 1i is formed to be encircled by the back of the key top 3, the inner peripheral surface of the annular holding portion 1 and the upper surface of the movable block body 1h. The luminous flux condensed by the light permeable movable block 1h can be uniformly diffused in the light diffusion space portion 1i to more clearly illuminate the stripping character portion 4a of the stripping character print layer 4. In FIG. 3, numeral 7 denotes a movable contact, 8 denotes a fixed contact, and 9 denotes a spacer.

I claim:

1. An illuminated button key characterized in that a key top formed of a light permeable hard resin is formed on the bottom of said key top with a stripping character print layer said stripping character print layer being formed on the bottom of said key top with a chromatic color light permeable print layer, said chromatic color light permeable print layer being adhered to the upper surface of an operating portion of said button key which is formed of alight permeable flexible rubber or a flexible resin by a light permeable adhesive, said operating portion being formed of said light permeable material integral with a non-operating portion, and non-light permeable coating layers which are formed on the remaining operating portion except for the upper surface of the operating portion and surfaces of the non-operating portion.

2. The illuminated button key according to claim 1, wherein a skirt portion constitutes a part of the operating portion adjacent to the non-operating portion and having an annular holding portion adjacent to the upper portion of said skirt portion which is formed of a non-light permeable flexible rubber or a flexible resin, said annular holding portion being internally formed of a light permeable movable block.

3. The illuminated button key according to claim 1, wherein a skirt portion constitutes a part of the operating portion adjacent to the non-operating portion and having an annular holding portion adjacent to the upper portion of said skirt portion which are formed of a non-light permeable flexible rubber or a flexible resin, said annular holding portion being a light permeable movable block, and having a light diffusion space portion which is encircled by the bottom of the key top and an inner peripheral surface on said annular holding portion and the upper surface of the movable block.

* * * * *